United States Patent
Sapotta et al.

[11] Patent Number: 5,584,069
[45] Date of Patent: Dec. 10, 1996

[54] HF MIXING STAGE IN THE FORM OF A COMMON-BASE CIRCUIT

[75] Inventors: Hans Sapotta; Heinz Rinderle, both of Heilbronn, Germany

[73] Assignee: Temic Telefunken Microelectronic GmbH, Heilbronn, Germany

[21] Appl. No.: 255,915

[22] Filed: Jun. 7, 1994

[30] Foreign Application Priority Data

Jun. 21, 1993 [DE] Germany .................. 43 20 457.0

[51] Int. Cl.⁶ .................................................. H04B 1/28
[52] U.S. Cl. ........................ 455/333; 455/326; 327/359
[58] Field of Search ................................. 455/333, 313,
455/326, 323, 325, 319, 320; 327/355,
356, 359, 484, 486

[56] References Cited

U.S. PATENT DOCUMENTS

| | | | |
|---|---|---|---|
| 4,080,573 | 3/1978 | Howell | 325/439 |
| 4,310,810 | 1/1982 | Toyomura et al. | 332/31 T |
| 4,636,663 | 1/1987 | Jongepier et al. | 307/529 |
| 4,667,342 | 5/1987 | Lindenmeier et al. | 455/150 |
| 5,329,189 | 7/1994 | Ushida et al. | 307/529 |
| 5,379,457 | 1/1995 | Nguyen | 455/323 |
| 5,410,744 | 4/1995 | Rinderle et al. | 455/333 |

FOREIGN PATENT DOCUMENTS

| | | |
|---|---|---|
| 0249776 | 2/1963 | Australia . |
| 0073929 | 3/1983 | European Pat. Off. . |
| 0557741 | 9/1993 | European Pat. Off. . |

*Primary Examiner*—Reinhard J. Eisenzopf
*Assistant Examiner*—Lee Nguyen
*Attorney, Agent, or Firm*—Spencer & Frank

[57] ABSTRACT

HF mixing stage in the form of a common-base circuit including: two bipolar amplifying transistors; two switching stages each assigned to an amplifying transistor and each having two emitter-coupled bipolar switching transistors and with two signal sources which supply the bases of the switching transistors with superimposed signals; two nodes at which the emitters of the switching transistors are connected to the collector of the associated amplifying transistor; two further output nodes at which the collectors of each of two switching transistors in different switching stages are connected together; circuit elements for electrical isolation through which the emitters of the amplifying transistors are connected together; an input signal source with associated internal resistor of which the one terminal is connected via the circuit input to the circuit elements for electrical isolation and the other terminal is connected to reference potential and whose signal is to be transposed into another frequency range through the mixing stage; and wherein: the two bipolar amplifying transistors are of different conduction type, and the two switching transistors of a respective switching stage are of the same conduction type as the associated bipolar amplifying transistor.

15 Claims, 4 Drawing Sheets

5,584,069

HF MIXING STAGE IN THE FORM OF A COMMON-BASE CIRCUIT

DESCRIPTION OF THE PRIOR ART

Multiplicative mixing stages for frequency conversion are used in a variety of areas involving HF: In radios, for instance, the received HF signal is converted to the intermediate frequency level (IF level) in accordance with the superheterodyne receiver principle. Multiplicative mixing stages of this kind consist of an "active part" with a (differential) amplifier stage with two amplifying transistors, to each of which two switching transistors are assigned, and of circuit elements for the in-phase addition of the currents through the switching transistors; the amplifying transistors are arranged either in the form of a common-emitter circuit (Gilbert cell) or—for higher transit frequencies—in the form of a common-base circuit. A disadvantage of such circuit arrangements is the very low large-signal handling capability—in radio receivers, for instance, this results in loss of dynamic response for the entire signal processing and, in view of the increasing density of transmitters, it represents a serious problem. Furthermore, known mixing stages in the form of common-base circuits must always be driven symmetrically; however, should they be required to process (asymmetrical) single-ended signals, additional balancing elements are necessary: in radio receivers, for instance, the resonating circuit between the input stage and the mixing stage is single ended.

SUMMARY OF THE INVENTION

The object of the invention is to provide a HF mixing stage in the form of a common-base circuit having good large-signal handling capability and in which it is possible to feed in the input signal asymmetrically and which is the type including: two bipolar amplifying transistors; two switching stages each associated with a respective amplifying transistor and each having two emitter-coupled bipolar switching transistors and a respective signal source which supplies the bases of the respective switching transistors with superimposed signals; two respective nodes at which the emitters of the switching transistors of a respective switching stage are connected together and to the collector of the associated amplifying transistor; two further output nodes at which the collectors of each of two switching transistors in different ones of the switching stages are connected together; circuit elements for electrical isolation connecting the emitters of the amplifying transistors together; and an input signal source with an associated internal resistor and having one terminal connected via the circuit input to the circuit elements for electrical isolation and the other terminal connected to a reference potential, with the signal from the input signal source being transposed into another frequency range through the mixing stage. This object is solved in accordance with the present invention by a HF mixing stage in the form of a common-base circuit of the type described above wherein the bipolar amplifying transistors are of different conduction type, and the two switching transistors of each switching stage are of the same conduction type as the associated amplifying transistor. Advantageous developments of the invention are described in the subclaims.

In the HF mixing stage according to the present invention, the amplifier stage-of the "active section" is not designed as a differential amplifier, but instead the difference is formed by the different conductivity type of the two amplifying transistors. The split input current is fed from the amplifying transistors to the associated switching transistors in the switching stage, for which purpose the collector of the respective amplifying transistor is connected to the emitters of the associated switching transistors. The outputs of the "active section" of the mixing stage are formed by the collectors of the switching transistors. At the two collector nodes (output nodes) of the switching stages, the output signal can be picked off differentially—for instance, with a resonant circuit the coil of which acts as primary winding of a transformer.

The circuit arrangement according to the present invention combines several advantages:

The large-signal handling capability can be improved considerably and hence the dynamic response of the receiver section can also be increased. This means that the linearity of the signal transmission is raised which becomes evident, for example, in the intermodulation behaviour—for instance, the interception point can be elevated by a considerable amount and/or the current drawn can at the same time be reduced.

Because the circuit has only one input, single-ended control or asymmetric feed-in of the input signal is possible. No balancing elements are needed.

BRIEF DESCRIPTION OF THE DRAWINGS

The further description of the present invention will be explained with the help of FIGS. 1 to 4, wherein.

DESCRIPTION OF PREFERRED EMBODIMENTS

Figure 1:
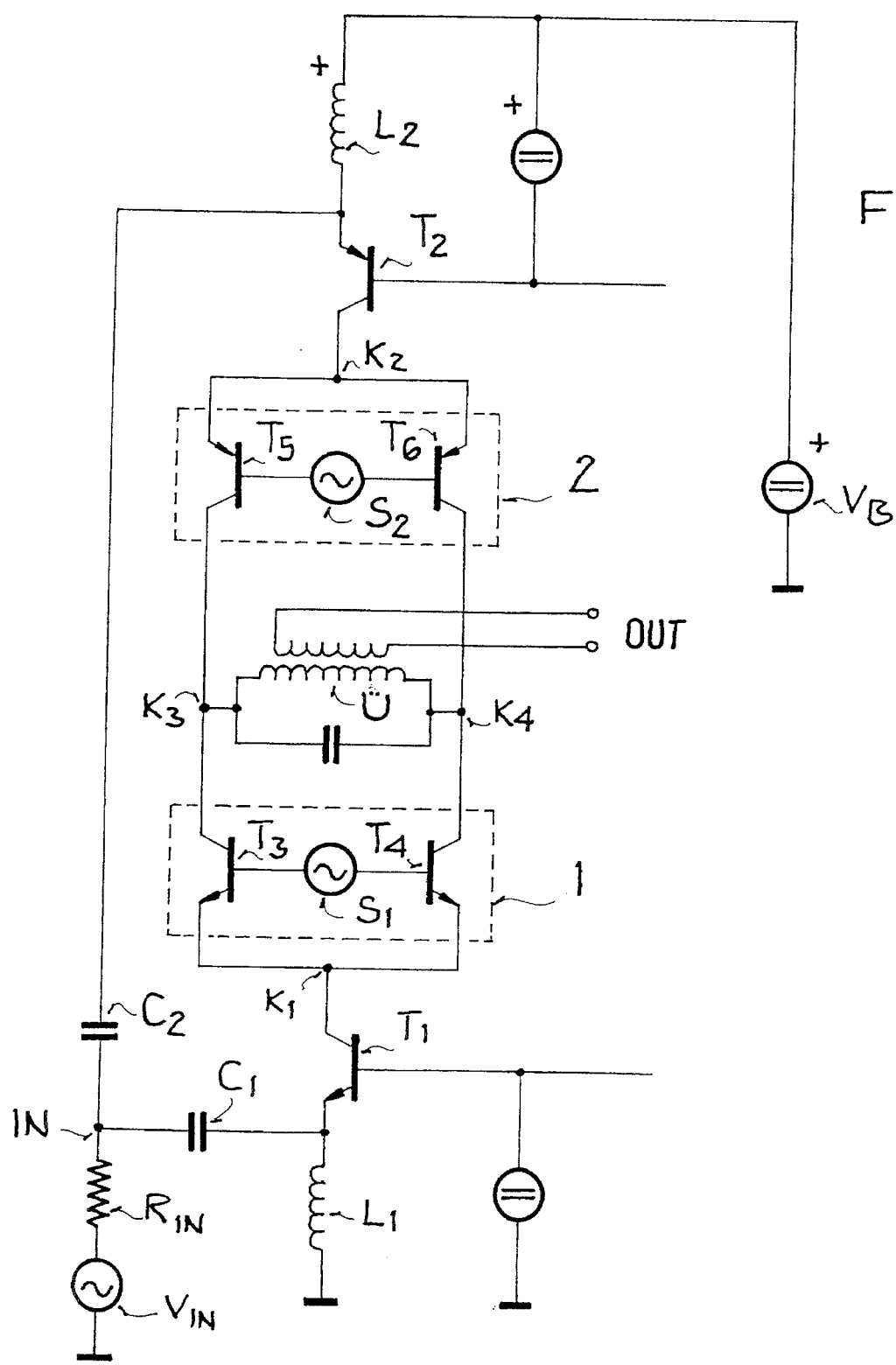
FIG. 1 is a schematic circuit arrangement of an embodiment example of the HF mixer according to the invention.

As can be seen in FIG. 1, the HF mixing stage includes the two emitter-coupled amplifying transistors $T_1$ and $T_2$ and in which the circuit input IN (at which the HF input signal of the input signal source $V_{IN}$ is fed in) is formed by the coupling point of the two emitters of the amplifying transistors $T_1$ and $T_2$. The bias points of the two amplifying transistors $T_1$ and $T_2$ can be specified in a variety of ways—for instance, according to FIGS. 1 and 2 by means of a biasing voltage at the bases of the amplifying transistors $T_1$ and $T_2$. The first switching stage 1 is connected to the collector of the first amplifying transistor $T_1$ with the two emitter-coupled transistors $T_3$ and $T_4$, and the second switching stage 2 is connected to the collector of the second amplifying transistor $T_2$ with the two emitter-coupled transistors $T_5$ and $T_6$. As well as suitable bias signals, the superimposed signals of the signal sources $S_1$ and $S_2$ (such as the signal from a local oscillator OSZ, for example) are fed to the bases of the switching transistors $T_3$, $T_4$ and $T_5$, $T_6$. The circuit elements of the two signal sources $S_1$ and $S_2$ of the respective switching stages 1 and 2 allow the common-mode voltage at the bases of the switching transistors $T_3$, $T_4$ and $T_5$, $T_6$ to be set such that the mean value of the voltage relative to the reference potential at the bases of the switching transistors $T_3$, $T_4$ and $T_5$, $T_6$ of each respective switching stage 1 and 2 is identical. The collectors of switching transistors $T_3$ and $T_5$ are connected together and form the first output node $K_3$, and the collectors of switching transistors $T_4$ and $T_6$ are connected together and form the second output node $K_4$ of the "active section" of the mixing stage. At the two output nodes $K_3$ and $K_4$ respectively, the output signal can be picked off differentially, for instance by means of the transformer Ü. The two amplifying transistors $T_1$ and $T_2$ are of complementary conduction type and, as shown in FIG. 1, the first amplifying transistor $T_1$ (connected to the negative terminal of the supply voltage source $V_B$) is an npn transistor and the second amplifying transistor $T_2$ (connected to the positive terminal of the supply voltage source $V_B$) is a pnp transistor. The switching transistors $T_3$, $T_4$ and $T_5$, $T_6$ of switching stage 1 and switching stage 2 respectively are of the same conductivity type as the amplifying transistor $T_1$ and $T_2$ respectively with which they are associated. Accordingly, as shown in FIG. 1, the two switching transistors $T_3$, $T_4$ of switching stage 1 are npn transistors, whereas the switching transistors $T_5$, $T_6$ of switching stage 2 are pnp transistors. The two switching transistors $T_3$, $T_4$ and $T_5$, $T_6$ of switching stages 1 and 2, respectively, are driven complementarily by the superimposed signals of the signal sources $S_1$ and $S_2$ in such a way that in each case one of the two switching transistors $T_3$, $T_6$ of a switching stage 1 or 2, respectively, goes into the non-conductive or conductive state, respectively. The injection at the circuit input IN of the input signal supplied from the signal source $V_{IN}$ with the internal resistor $R_{IN}$ is effected in accordance with FIG. 1 via the two capacitors $C_1$ and $C_2$. As an alternative to this, a transformer Tr with 3 windings $W_1$, $W_2$, $W_3$ can be provided (as shown in FIG. 2) in which one of windings $W_1$ or $W_2$ is connected to the emitter of one of the amplifying transistors $T_1$ or $T_2$ respectively and the third winding $W_3$ is connected to the signal source $V_{IN}$ for the purpose of injecting the input signal.

Figure 2:
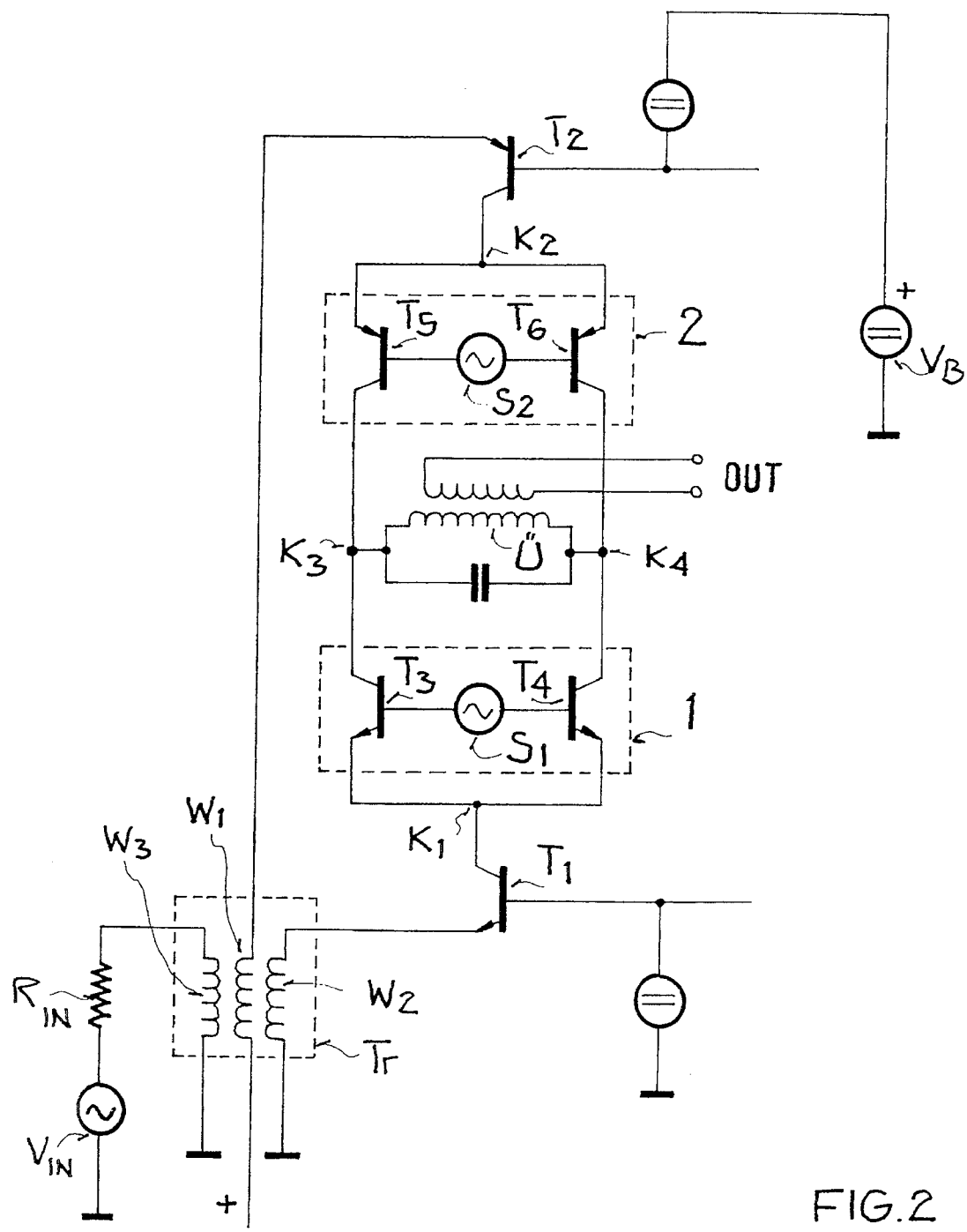
FIG. 2 is a schematic circuit arrangement of an embodiment of an HF mixer according to the invention showing an alternative for input coupling with a transformer.
Figure 3:
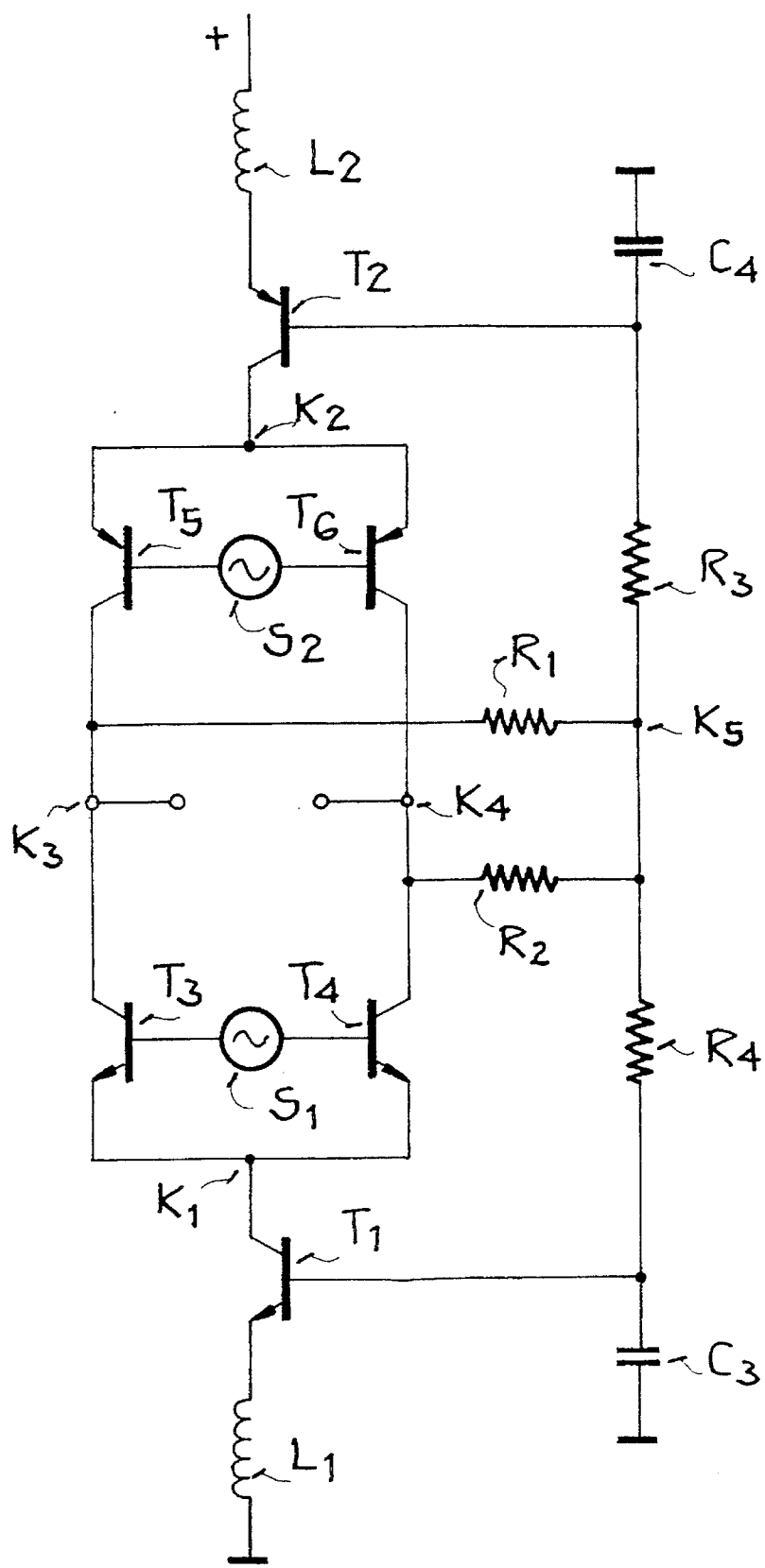
FIG. 3 is a schematic circuit arrangement showing a modification including an example for generating the base voltage of the amplifying transistors.
Figure 4:
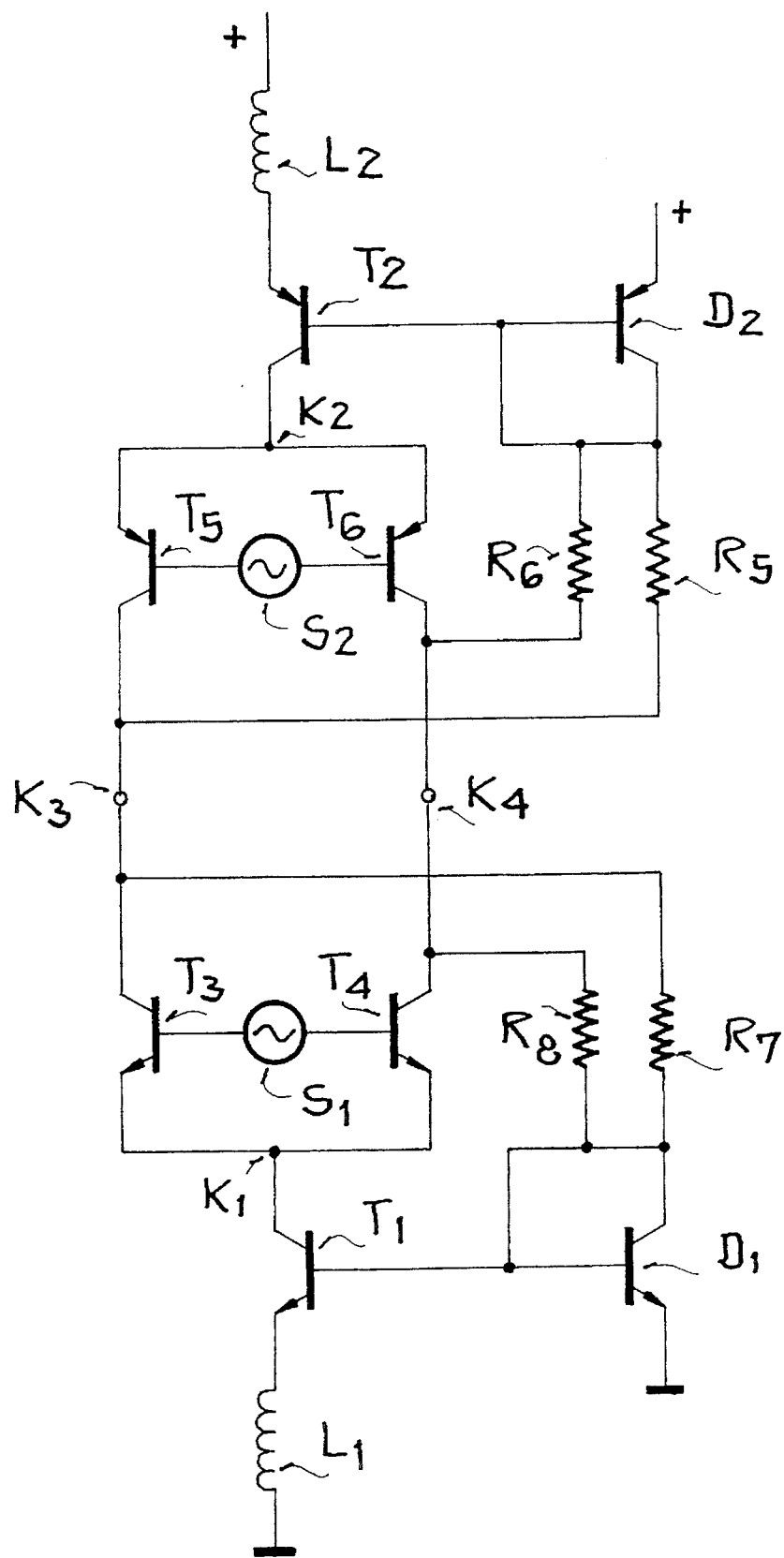
FIG. 4 is a schematic circuit arrangement showing another embodiment example of the DC stabilization for a circuit according to the invention.

FIGS. 3 and 4 show two embodiment examples for generating the base voltage of the two amplifying transistors $T_1$, $T_2$ with which stabilization of the bias point of the amplifying transistors $T_1$, $T_2$ can be achieved compared with the pure base biasing voltage according to FIGS. 1 and 2. According to FIG. 3, resistors $R_1$, $R_2$, $R_3$ and $R_4$ are provided for this purpose: each of the two resistors $R_3$, $R_4$ is connected to the base of one of the two amplifying transistors $T_1$, $T_2$ and the two other terminals are connected together at the node $K_5$. One terminal of each of the two resistors $R_1$ and $R_2$ is connected at this node $K_5$, and the other terminal is connected to the output nodes $K_3$ and $K_4$ respectively. Consequently, a DC negative feedback is supplied to the bases of the two amplifying transistors $T_1$, $T_2$ that has the effect of stabilizing the bias point and compensating the tolerance. The two capacitors $C_3$ and $C_4$ connected to the bases of the amplifying transistors $T_1$, $T_2$ serve to block off any HF components that might possibly also be negatively fed back.

As an alternative to this, as shown in FIG. 4, the mean value of the voltage at the output nodes $K_3$, $K_4$ is generated by resistors $R_5$, $R_6$, $R_7$, $R_8$ and fed to the bases of the two amplifying transistors $T_1$, $T_2$ via current mirrors (diodes $D_1$, $D_2$).

With the circuit that has been described, the linearity of the transmission (expressed, for instance, in the intermodulation behaviour or interception point) can be significantly increased or the required current can be reduced while at the same time the noise characteristics are not worsened. For this reason, the circuit is used by preference wherever high linearity and/or low current consumption is needed. Examples of this include cordless telephone applications, receiver circuits operating on the direct mixing principle, phase comparators, highly linear multiplier circuits etc.

What is claimed is:

1. HF mixing stage in the form of a common-base circuit comprising:

a) two bipolar amplifying transistors, b) two switching stages each associated with a respective amplifying transistor, each having two emitter-coupled bipolar switching transistors and each having a respective signal source which supplies the bases of the switching transistors of the respective switching stage with superimposed signals, c) two respective nodes at which the emitters of the switching transistors of a respective switching stage are connected together and to the collector of the associated amplifying transistor, d) two further respective output nodes at which the collectors of each of two switching transistors in different ones of said two switching stages are connected together, e) circuit elements for electrical isolation connecting the emitters of the amplifying transistors together, f) an input signal source with an associated internal resistor and having one terminal connected via circuit input to the circuit elements for electrical isolation and a second terminal connected to a reference potential, said input signal source supplying a signal which is to be transposed into another frequency range through the HF mixing stage; and wherein:

g) the two bipolar amplifying transistors are of different conduction type and are each connected in a common-base circuit configuration, h) the two switching transistors of each respective switching stage are of the same conduction type as the associated one of said two bipolar amplifying transistors.

2. Mixing stage in accordance with claim 1, wherein circuit elements of the two signal sources of the respective switching stages allow the common-mode voltage at the bases of the two switching transistors to be set such that a mean value of the voltage relative to the reference potential at the bases of the respective switching transistors of each respective switching stage is identical.

3. Mixing stage in accordance with claim 2, wherein the two switching transistors of a respective switching stage are driven complementarily by the superimposed signals of the signal sources such that in each case one of the two switching transistors of a switching stage goes into a conductive or non-conductive state and the other switching transistor of the switching stage goes into the non-conductive or conductive state, respectively.

4. Mixing stage in accordance with claim 1, wherein the two switching transistors of a respective switching stage are driven complementarily by the superimposed signals of the respective signal sources such that in each case one of the two switching transistors of a respective switching stage goes into a conductive or non-conductive state and the other switching transistor of the respective switching stage goes into the non-conductive or conductive state, respectively.

5. Mixing stage in accordance with claim 1, wherein the circuit output is formed by the two further respective output nodes between which the output voltage ($U_{OUT}$) is picked off differentially via output circuit elements.

6. Mixing stage in accordance with claim 1, wherein: one of said amplifying transistors in an npn transistor, and further comprising at least one further circuit element connecting the emitter of the npn amplifying transistor for DC supply and AC isolation to the negative connection of a supply voltage source.

7. Mixing stage in accordance with claim 1, wherein: one of said amplifying transistors is a pnp transistor, and further comprising at least a further circuit element connecting the emitter of the pnp amplifying transistor for DC supply and AC isolation to the positive connection of a supply voltage source.

8. Mixing stage in accordance with claim 1, wherein said circuit elements for electrical isolation provide for DC isolation and are connected to said circuit input such that an input signal applied to the circuit input is fed in parallel into the emitters of the two bipolar amplifying transistors.

9. Mixing stage in accordance with claim 1, wherein the two bipolar amplifying transistors include a pnp amplifying transistor and a npn amplifying transistor, wherein for the purposes of coupling in the input signal, a transformer with 3 windings is provided, wherein the first winding of the Transformer is connected at one terminal with the emitter of the pnp amplifying transistor and at the other terminal with the positive connection of a supply voltage source, wherein the second winding of the transformer is connected at one terminal with the emitter of the npn amplifying transistor and at the other terminal with the negative connection of the supply voltage source, and wherein the third winding of the transformer is connected at one terminal to the input signal source and at the other terminal with the negative connection for the supply voltage source.

10. Mixing stage in accordance with claim 1, further comprising further circuit elements connected to the output nodes to provide negative feedback effective for direct current to the bases of the two bipolar amplifying transistors in order to stabilize the bias points of the two bipolar amplifying transistors.

11. Mixing stage in accordance with claim 10, wherein said further circuit elements include two resistors having respective first terminals connected together at another node and having respective other terminals connected to the base of a respective one of said two bipolar amplifying transistors, and wherein at the another node a voltage is applied that corresponds to a mean value of the voltage at the two output nodes.

12. Mixing stage in accordance with claim 11, wherein said further circuit elements further includes two further resistors which generate the mean value of the voltage at the two output nodes, and wherein one terminal of each of the two further resistors is connected to a respective one of said output nodes and wherein the other terminals of the two further resistors are connected together at the another node.

13. Mixing stage in accordance with claim 10, wherein said further circuit elements include two diodes which are connected as circuit mirrors in the direction of current flow with the respective bases of the two bipolar amplifying transistors and with the minus terminal and with the plus terminal respectively of a supply voltage source such that current balancing is obtained in the mixer for setting the bias current.

14. Mixing stage in accordance with claim 13, wherein reference currents of the two current mirrors are generated via additional circuit elements from mean values of the voltage at the output nodes.

15. Mixing stage in accordance with claim 1, wherein at least one further circuit element is connected to the bases of the two bipolar amplifying transistors for blocking off high frequencies.

* * * * *